United States Patent
Gadkaree (10) Patent No.: US 7,456,080 B2
(45) Date of Patent: Nov. 25, 2008

(54) SEMICONDUCTOR ON GLASS INSULATOR MADE USING IMPROVED ION IMPLANTATION PROCESS

(75) Inventor: Kishor Purushottam Gadkaree, Big Flats, NY (US)

(73) Assignee: Corning Incorporated, Corning, NY (US)

( * ) Notice: Subject to any disclaimer, the term of this patent is extended or adjusted under 35 U.S.C. 154(b) by 256 days.

(21) Appl. No.: 11/313,206

(22) Filed: Dec. 19, 2005

(65) Prior Publication Data

US 2007/0141802 A1   Jun. 21, 2007

(51) Int. Cl.
  *H01L 21/76* (2006.01)
(52) U.S. Cl. ............................... 438/407; 438/149
(58) Field of Classification Search .............. 438/455, 438/149, 407; 257/E21.561, E21.57, E21.704
  See application file for complete search history.

(56) References Cited

U.S. PATENT DOCUMENTS

| | | | |
|---|---|---|---|
| 5,374,564 A | 12/1994 | Bruel | 438/455 |
| 5,854,123 A | 12/1998 | Sato et al. | 438/507 |
| 5,966,620 A | 10/1999 | Sakaguchi et al. | 438/455 |
| 6,010,579 A | 1/2000 | Henley et al. | 148/332 |
| 6,027,988 A | 2/2000 | Cheung et al. | 438/513 |
| 6,146,979 A | 11/2000 | Henley et al. | 438/458 |
| 6,150,239 A | 11/2000 | Goesele et al. | 438/458 |
| 6,211,041 B1 | 4/2001 | Ogura | 438/458 |
| 6,245,645 B1 | 6/2001 | Mitani et al. | 438/455 |
| 6,251,754 B1 | 6/2001 | Ohshima et al. | 438/506 |
| 6,303,468 B1 | 10/2001 | Aspar et al. | 438/455 |
| 6,312,797 B1 | 11/2001 | Yokokawa et al. | 428/336 |
| 6,350,702 B2 | 2/2002 | Sakaguchi et al. | 438/753 |
| 6,429,104 B1 | 8/2002 | Auberton-Herve | 438/527 |
| 6,468,884 B2 | 10/2002 | Miyake et al. | 438/481 |
| 6,544,862 B1 | 4/2003 | Bryan | 438/455 |
| 6,566,233 B2 | 5/2003 | Yokokawa et al. | 438/455 |
| 6,597,039 B2 | 7/2003 | Ohmi et al. | 257/347 |
| 6,610,582 B1 | 8/2003 | Stewart | 438/455 |
| 6,613,678 B1 | 9/2003 | Sakaguchi et al. | 438/695 |
| 6,852,652 B1 | 2/2005 | Maa et al. | 438/933 |
| 2003/0183876 A1 | 10/2003 | Takafuji et al. | 257/347 |
| 2004/0171196 A1 | 9/2004 | Walitzki | 438/137 |
| 2004/0214434 A1 | 10/2004 | Atwater et al. | 438/689 |
| 2004/0229444 A1 | 11/2004 | Couillard et al. | 438/455 |
| 2004/0232488 A1 | 11/2004 | Forbes | 257/347 |
| 2005/0026650 A1 | 2/2005 | Russell | 106/22 |
| 2005/0032330 A1 | 2/2005 | Ghyselen et al. | 438/455 |

(Continued)

FOREIGN PATENT DOCUMENTS

WO   WO2005029576   5/2005

OTHER PUBLICATIONS

Agarwal et al., Efficient production of silicon-on-insulator films by co-implantation of He+ with H+, Applied Physics Letters, vol. 72, No. 9 (1998) pp. 1086-1088.*

*Primary Examiner*—Carl Whitehead, Jr.
*Assistant Examiner*—Sonya D McCall Shepard
(74) *Attorney, Agent, or Firm*—Timothy M. Schaeberle (57) ABSTRACT

Methods and apparatus for producing a semiconductor on glass (SOG) structure include: subjecting an implantation surface of a donor semiconductor wafer to multiple ion implantation processes to create an exfoliation layer in the donor semiconductor wafer, wherein at least one of: (i) the type of ion, (ii) the dose, and/or (iii) the implantation energy of at least two of the multiple ion implantation processes differ from one another.

20 Claims, 6 Drawing Sheets

U.S. PATENT DOCUMENTS

| | | |
|---|---|---|
| 2005/0040073 A1 | 2/2005 | Cody et al. ............... 208/89 |
| 2005/0042842 A1 | 2/2005 | Lei et al. ............... 438/459 |
| 2005/0070071 A1 | 3/2005 | Henley et al. ............ 438/459 |
| 2005/0079664 A1 | 4/2005 | Faris ..................... 438/200 |
| 2005/0085049 A1 | 4/2005 | Atwater, Jr. et al. ...... 438/455 |

\* cited by examiner

SEMICONDUCTOR ON GLASS INSULATOR MADE USING IMPROVED ION IMPLANTATION PROCESS

BACKGROUND

The present invention relates to the manufacture of a semiconductor-on-insulator (SOI) structure using an improved ion implantation process.

To date, the semiconductor material most commonly used in semiconductor-on-insulator structures has been silicon. Such structures have been referred to in the literature as silicon-on-insulator structures and the abbreviation "SOI" has been applied to such structures. SOI technology is becoming increasingly important for high performance thin film transistors, solar cells, and displays, such as, active matrix displays. SOI structures may include a thin layer of substantially single crystal silicon (generally 0.1-0.3 microns in thickness but, in some cases, as thick as 5 microns) on an insulating material.

For ease of presentation, the following discussion will at times be in terms of SOI structures. The references to this particular type of SOI structure are made to facilitate the explanation of the invention and are not intended to, and should not be interpreted as, limiting the invention's scope in any way. The SOI abbreviation is used herein to refer to semiconductor-on-insulator structures in general, including, but not limited to, silicon-on-insulator structures. Similarly, the SOG abbreviation is used to refer to semiconductor-on-glass structures in general, including, but not limited to, silicon-on-glass structures. The SOG nomenclature is also intended to include semiconductor-on-glass-ceramic structures, including, but not limited to, silicon-on-glass-ceramic structures. The abbreviation SOI encompasses SOG structures.

Various ways of obtaining SOI structures wafer include epitaxial growth of silicon (Si) on lattice matched substrates. An alternative process includes the bonding of a single crystal silicon wafer to another silicon wafer on which an oxide layer of $SiO_2$ has been grown, followed by polishing or etching of the top wafer down to, for example, a 0.1 to 0.3 micron layer of single crystal silicon. Further methods include ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

The former two methods have not resulted in satisfactory structures in terms of cost and/or bond strength and durability. The latter method involving hydrogen ion implantation has received some attention and has been considered advantageous over the former methods because the implantation energies required are less than 50% of that of oxygen ion implants and the dosage required is two orders of magnitude lower.

U.S. Pat. No. 5,374,564 discloses a process to obtain a single crystal silicon film on a substrate using a thermal process. A semiconductor material wafer having a planar face is subject to the following steps: (i) implantation by bombardment of a face of the wafer by means of ions creating a layer of gaseous micro-bubbles defining a lower region constituting the mass of the substrate and an upper region constituting the thin film; (ii) contacting the planar face of the wafer with a stiffener constituted by at least one rigid material layer; and (iii) a third stage of heat treating the assembly of the wafer and the stiffener at a temperature above that at which the ion bombardment was carried out and sufficient to create a pressure effect in the micro-bubbles and a separation between the thin film and the mass of the substrate. Due to the high temperature steps, this process does not work with lower cost glass or glass-ceramic substrates.

Cost is an important consideration for commercial applications of SOI structures. A significant part of the cost of the above-described method and structure has been the cost of the silicon wafer which supports the oxide layer, topped by the Si thin film, i.e., a major part of the cost has been the support substrate. Although the use of quartz as a support substrate has been mentioned in various patents (see U.S. Pat. Nos. 6,140,209 6,211,041, 6,309,950, 6,323,108, 6,335,231, and 6,391,740), quartz is itself a relatively expensive material. In discussing support substrates, some of the above references have mentioned quartz glass, glass, and glass-ceramics. Other support substrate materials listed in these references include diamond, sapphire, silicon carbide, silicon nitride, ceramics, metals, and plastics.

U.S. Patent Application No. 2004/0229444 discloses a process that produces a SOG structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; and (iv) cooling the structure to a common temperature to facilitate separation of the glass substrate and a thin layer of silicon from the silicon wafer.

A significant cost (and likely the highest cost element) in producing the SOG structure disclosed in U.S. 2004/0229444 is incurred during the ion implantation step. The ion implantation dose disclosed in U.S. 2004/0229444 is in the range of about 5-8 $10^{16}$ ions/cm$^2$. Although this implantation dose is believed to result in high quality SOG structures, it has been discovered that the cost to produce the SOG structure may be significantly reduced (perhaps by as much as 75-80%) by manipulating the ion implantation process in accordance with various embodiments of the present invention. In addition, it is believed that a significant improvement in processing throughput may be achieved by adjusting the ion implantation process.

SUMMARY OF THE INVENTION

In accordance with one or more embodiments of the present invention, methods and apparatus of forming a semiconductor on glass structure, include: subjecting an implantation surface of a donor semiconductor wafer to multiple ion implantation processes to create an exfoliation layer in the donor semiconductor wafer, wherein at least one of: the type of ion, the dose, and/or the implantation energy of at least two of the multiple ion implantation processes differ from one another.

In accordance with one or more further embodiments of the present invention, methods and apparatus of forming a semiconductor on glass structure, include: subjecting an implantation surface of a donor semiconductor wafer to a first ion implantation process to initiate the creation of an exfoliation layer in the donor semiconductor wafer; subjecting the implantation surface of the donor semiconductor wafer to at least a second ion implantation process, wherein at least one of: the type of ion, the dose, and/or the implantation energy of the second ion implantation process differs from the first ion implantation process; and bonding the implantation surface of the exfoliation layer to the glass substrate using electrolysis.

The donor semiconductor wafer may be taken from the group consisting of: silicon (Si), germanium-doped silicon (SiGe), silicon carbide (SiC), germanium (Ge), gallium arsenide (GaAs), GaP, and InP.

One of the first and second ion implantation processes may include subjecting the implantation surface to hydrogen ion implantation to create of an area of weakening below the implantation surface of the donor semiconductor wafer. The hydrogen ion implantation may be conducted at a dose of between about $2\text{-}10\times10^{15}$ ions/cm$^2$. For example, the hydrogen ion implantation may be conducted at a dose of about $5\times10^{15}$ ions/cm$^2$. The hydrogen ion implantation may be conducted at an implantation energy of between about 25-150 KeV. For example, the hydrogen ion implantation may be conducted at an implantation energy of about 100 KeV or about 70 KeV.

The other of the first and second ion implantation processes may include subjecting the implantation surface to at least one of helium and boron ion implantation to further create the area of weakening below the implantation surface.

The at least one of helium and boron ion implantation may be conducted at a dose of between about $2\text{-}10\times10^{15}$ ions/cm$^2$. For example, the at least one of helium and boron ion implantation may be conducted at a dose of about $7.5\times10^{15}$ ions/cm$^2$. The at least one of helium and boron ion implantation may be conducted at an implantation energy of between about 25-150 KeV. For example, the implantation energy may be about 65 KeV or about 40 KeV.

The total dose of the first ion implantation process and the at least one second ion implantation process may be between about $10\text{-}20\times10^{15}$ ions/cm$^2$, and about $12.5\times10^{15}$ ions/cm$^2$.

In one embodiment, the step of bonding may include: heating at least one of the glass substrate and the donor semiconductor wafer; bringing the glass substrate into direct or indirect contact with the donor semiconductor wafer through the exfoliation layer; and applying a voltage potential across the glass substrate and the donor semiconductor wafer to induce the bond. The temperature of the glass substrate and the semiconductor wafer may be elevated to within about 150 degrees C. of the strain point of the glass substrate. The temperatures of the glass substrate and the semiconductor wafer may be elevated to different levels. The voltage potential across the glass substrate and the semiconductor wafer may be between about 100 to 2000 volts. Stress may be induced by cooling the bonded glass substrate, exfoliation layer, and donor semiconductor wafer such that a fracture occurs substantially at the exfoliation layer.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PRESENT INVENTION

Figure 1:
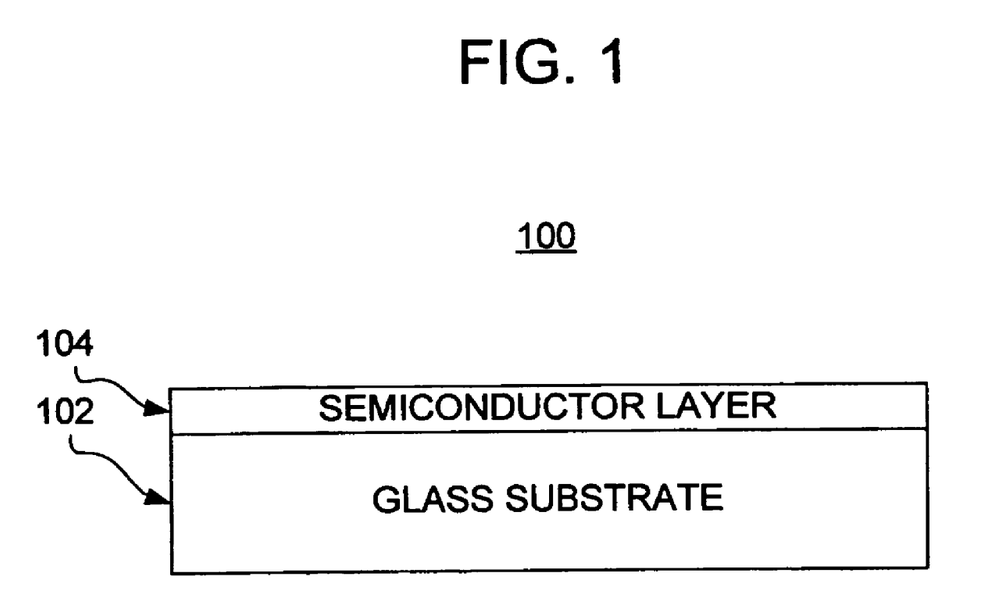
FIG. 1 is a block diagram illustrating the structure of an SOG device in accordance with one or more embodiments of the present invention.

With reference to the drawings, wherein like numerals indicate like elements, there is shown in FIG. 1 an SOG structure 100 in accordance with one or more embodiments of the present invention. The SOG structure 100 may include a glass substrate 102, and a semiconductor layer 104. The SOG structure 100 has suitable uses in connection with fabricating thin film transistors (TFTs), e.g., for display applications, including organic light-emitting diode (OLED) displays and liquid crystal displays (LCDs), integrated circuits, photovoltaic devices, etc.

The semiconductor material of the layer 104 may be in the form of a substantially single-crystal material. The word "substantially" is used in describing the layer 104 to take account of the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor.

For the purposes of discussion, it is assumed that the semiconductor layer 104 is formed from silicon. It is understood, however, that the semiconductor material may be a silicon-based semiconductor or any other type of semiconductor, such as, the III-V, II-IV, II-IV-V, etc. classes of semiconductors. Examples of these materials include: silicon (Si), germanium-doped silicon (SiGe), silicon carbide (SiC), germanium (Ge), gallium arsenide (GaAs), GaP, and InP.

The glass substrate 102 may be formed from an oxide glass or an oxide glass-ceramic. Although not required, the embodiments described herein may include an oxide glass or glass-ceramic exhibiting a strain point of less than about 1,000 degrees C. As is conventional in the glass making art, the strain point is the temperature at which the glass or glass-ceramic has a viscosity of $10^{14.6}$ poise ($10^{13.6}$ Pa·s). As between oxide glasses and oxide glass-ceramics, the glasses may have the advantage of being simpler to manufacture, thus making them more widely available and less expensive.

By way of example, the glass substrate 102 may be formed from glass substrates containing alkaline-earth ions, such as, substrates made of CORNING INCORPORATED GLASS COMPOSITION NO. 1737 or CORNING INCORPORATED GLASS COMPOSITION NO. EAGLE 2000™. These glass materials have particular use in, for example, the production of liquid crystal displays.

The glass substrate may have a thickness in the range of about 0.1 mm to about 10 mm, such as in the range of about 0.5 mm to about 3 mm. For some SOI structures, insulating layers having a thickness greater than or equal to about 1 micron are desirable, e.g., to avoid parasitic capacitive effects which arise when standard SOI structures having a silicon/silicon dioxide/silicon configuration are operated at high frequencies. In the past, such thicknesses have been difficult to achieve. In accordance with the present invention, an SOI structure having an insulating layer thicker than about 1 micron is readily achieved by simply using a glass substrate 102 having a thickness that is greater than or equal to about 1 micron. A lower limit on the thickness of the glass substrate 102 may be about 1 micron.

In general, the glass substrate 102 should be thick enough to support the semiconductor layer 104 through the process steps of the invention, as well as subsequent processing performed on the SOG structure 100. Although there is no theoretical upper limit on the thickness of the glass substrate 102, a thickness beyond that needed for the support function or that desired for the ultimate SOG structure 100 might not be advantageous since the greater the thickness of the glass substrate 102, the more difficult it will be to accomplish at least some of the process steps in forming the SOG structure 100.

The oxide glass or oxide glass-ceramic substrate 102 may be silica-based. Thus, the mole percent of $SiO_2$ in the oxide glass or oxide glass-ceramic may be greater than 30 mole % and may be greater than 40 mole %. In the case of glass-ceramics, the crystalline phase can be mullite, cordierite, anorthite, spinel, or other crystalline phases known in the art for glass-ceramics. Non-silica-based glasses and glass-ceramics may be used in the practice of one or more embodiments of the invention, but are generally less advantageous because of their higher cost and/or inferior performance characteristics. Similarly, for some applications, e.g., for SOI structures employing semiconductor materials that are not silicon-based, glass substrates which are not oxide based, e.g., non-oxide glasses, may be desirable, but are generally not advantageous because of their higher cost. As will be discussed in more detail below, in one or more embodiments, the glass or glass-ceramic substrate 102 is designed to match a coefficient of thermal expansion (CTE) of one or more semiconductor materials (e.g., silicon, germanium, etc.) of the layer 104 that are bonded thereto. The CTE match ensures desirable mechanical properties during heating cycles of the deposition process.

For certain applications, e.g., display applications, the glass or glass-ceramic 102 may be transparent in the visible, near UV, and/or IR wavelength ranges, e.g., the glass or glass ceramic 102 may be transparent in the 350 nm to 2 micron wavelength range.

Although the glass substrate 102 may be composed of a single glass or glass-ceramic layer, laminated structures can be used if desired. When laminated structures are used, the layer of the laminate closest to the semiconductor layer 104 may have the properties discussed herein for a glass substrate 102 composed of a single glass or glass-ceramic. Layers farther from the semiconductor layer 104 may also have those properties, but may have relaxed properties because they do not directly interact with the semiconductor layer 104. In the latter case, the glass substrate 102 is considered to have ended when the properties specified for a glass substrate 102 are no longer satisfied.

Figure 2:
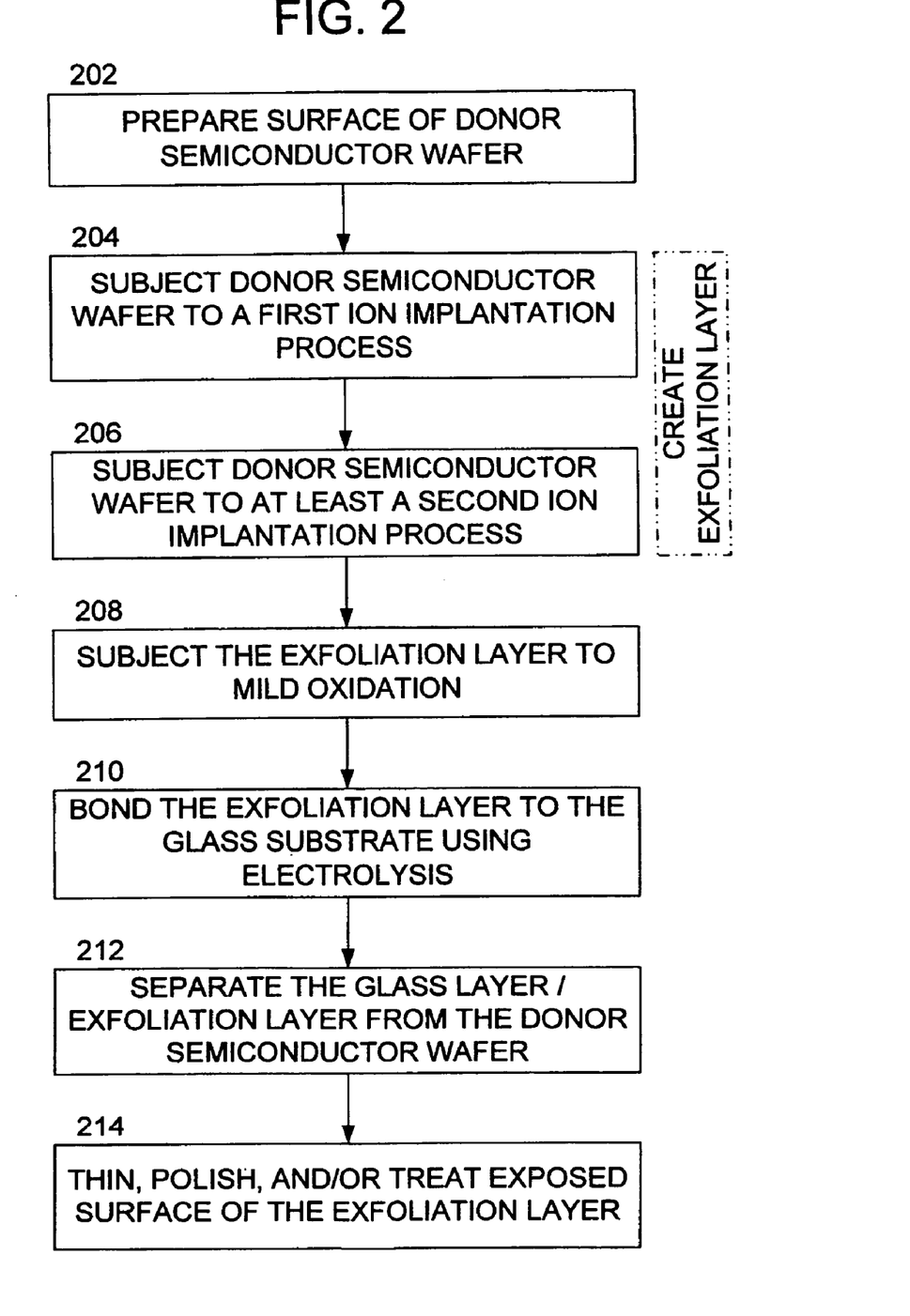
FIG. 2 is a flow diagram illustrating process steps that may be carried out to produce the SOG structure of FIG. 1.
Figure 3:
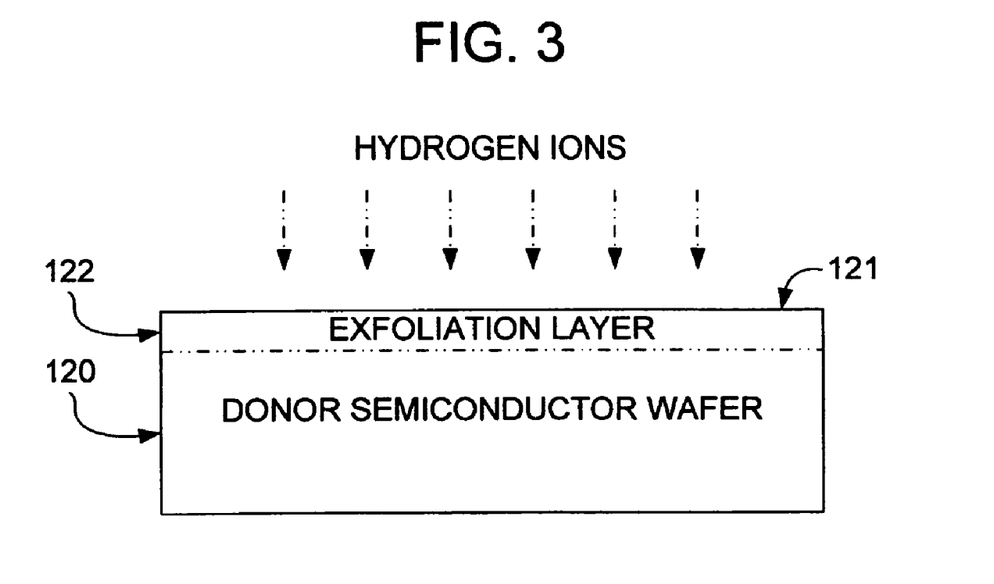
FIGS. 3-7 are block diagrams illustrating intermediate and final structures formed using the process of FIG. 2.

Reference is now made to FIGS. 2-7. FIG. 2 illustrates process steps that may be carried out in order to produce the SOG structure 100 of FIG. 1 (and/or other embodiments disclosed herein), while FIGS. 3-7 illustrate intermediate structures that may be formed in carrying out the process of FIG. 2. Turning first to FIGS. 2 and 3, at action 202, an implantation surface 121 of a donor semiconductor wafer 120 is prepared, such as by polishing, cleaning, etc. to produce a relatively flat and uniform implantation surface 121 suitable for bonding to the glass or glass-ceramic substrate 102. For the purposes of discussion, the semiconductor wafer 120 may be a substantially single crystal Si wafer, although as discussed above any other suitable semiconductor conductor material may be employed.

At actions 204-206, an exfoliation layer 122 is created by subjecting the implantation surface 121 to multiple ion implantation processes to create a weakened region below the implantation surface 121 of the donor semiconductor wafer 120. At action 204, the implantation surface 121 of the donor semiconductor wafer 120 is subject to a first ion implantation process to initiate the creation of the exfoliation layer 122 in the donor semiconductor wafer 120. At action 206, the implantation surface 121 is subject to at least a second ion implantation process to complete the creation of the exfoliation layer 122. At least one of: (i) the type of ion, (ii) the dose, and (iii) the implantation energy, of the second ion implantation process may differ from the first ion implantation process.

Figure 4:
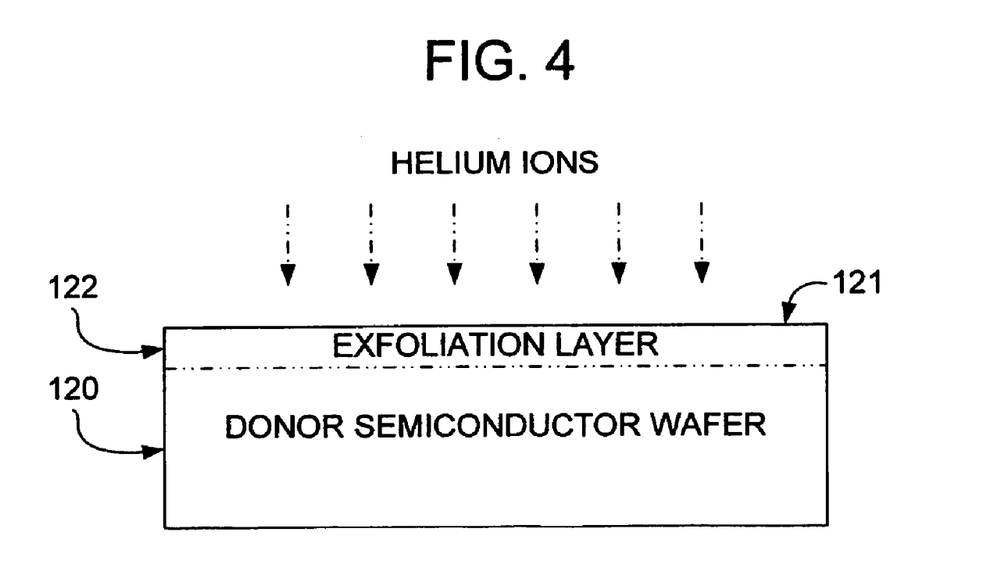

In one or more embodiments, at action 204 the implantation surface 121 may be first subject to hydrogen ion implantation (FIG. 3). The dose of the initial hydrogen ion implantation step may be between about $2-10\times10^{15}$ ions/cm$^2$, where a dose of about $5\times10^{15}$ ions/cm$^2$ is possible (which is less than $7.5\times10^{15}$ ions/cm$^2$). Notably, this dosage is substantially lower than the ion implantation dosage disclosed in, for example, U.S. Patent Application No. 2004/0229444. The implantation energy of the initial hydrogen ion implantation step may be between about 25-150 KeV, such as an implantation energy of about 100 KeV. At action 206 the implantation surface 121 may then be subject to helium ion implantation (FIG. 4). For example, the dose of the helium ion implantation step may be between about $2-10\times10^{15}$ ions/cm$^2$, where a dose of about $7.5\times10^{15}$ ions/cm$^2$ is also possible (which is less than $1\times10^{16}$ ions/cm$^2$). Again, this dosage is substantially lower than the ion implantation dosage disclosed in, for example, U.S. Patent Application No. 2004/0229444. The implantation energy of the subsequent helium ion implantation step may also be between about 25-150 KeV, such as an implantation energy of about 65 KeV.

Assuming for the sake of discussion that only two ion implantation processes are carried out to produce the exfoliation layer 122, the total dose is the sum of the respective doses of the first and second ion implantation processes. Thus, for example, a total dose of about $12.5\times10^{15}$ ions/cm$^2$ (which is less than $1.75\times10^{16}$ ions/cm$^2$) would result when a first ion implantation dose of hydrogen ions is conducted at about $5\times10^{15}$ ions/cm$^2$ followed by a second ion implantation dose of helium ions at about $7.5\times10^{15}$ ions/cm$^2$. Notably, the total dose of about $12.5\times10^{15}$ ions/cm$^2$ is about four times less than the ion implantation dose disclosed in U.S. Patent Application No. 2004/0229444.

It is contemplated that alternative embodiments of the present invention may be achieved by reversing the order of the respective hydrogen and helium ion implantation steps. In addition, it is also contemplated that any of the known ion types may be employed during the respective implantation steps, such as boron, hydrogen, helium, etc. Thus, pairs of ion implantation steps may include helium+hydrogen, boron+hydrogen, boron+helium, or other ion combinations without departing from the spirit and scope of the present invention. Still further, while two ion implantation steps are possible, three or more ion implantation steps may be employed to complete the creation of the exfoliation layer 122.

At action 208 the donor semiconductor wafer 120 may be treated to reduce, for example, the hydrogen ion concentration on the implantation surface 121. For example, the donor semiconductor wafer 120 may be washed and cleaned and the implantation donor surface 121 of the exfoliation layer 122 may be subject to mild oxidation. The mild oxidation treatments may include treatment in oxygen plasma, ozone treatments, treatment with hydrogen peroxide, hydrogen peroxide and ammonia, hydrogen peroxide and an acid or a combination of these processes. It is expected that during these treatments hydrogen terminated surface groups oxidize to hydroxyl groups, which in turn also makes the surface of the silicon wafer hydrophilic. The treatment may be carried out at room temperature for the oxygen plasma and at temperature between 25-150° C. for the ammonia or acid treatments.

Figure 5:
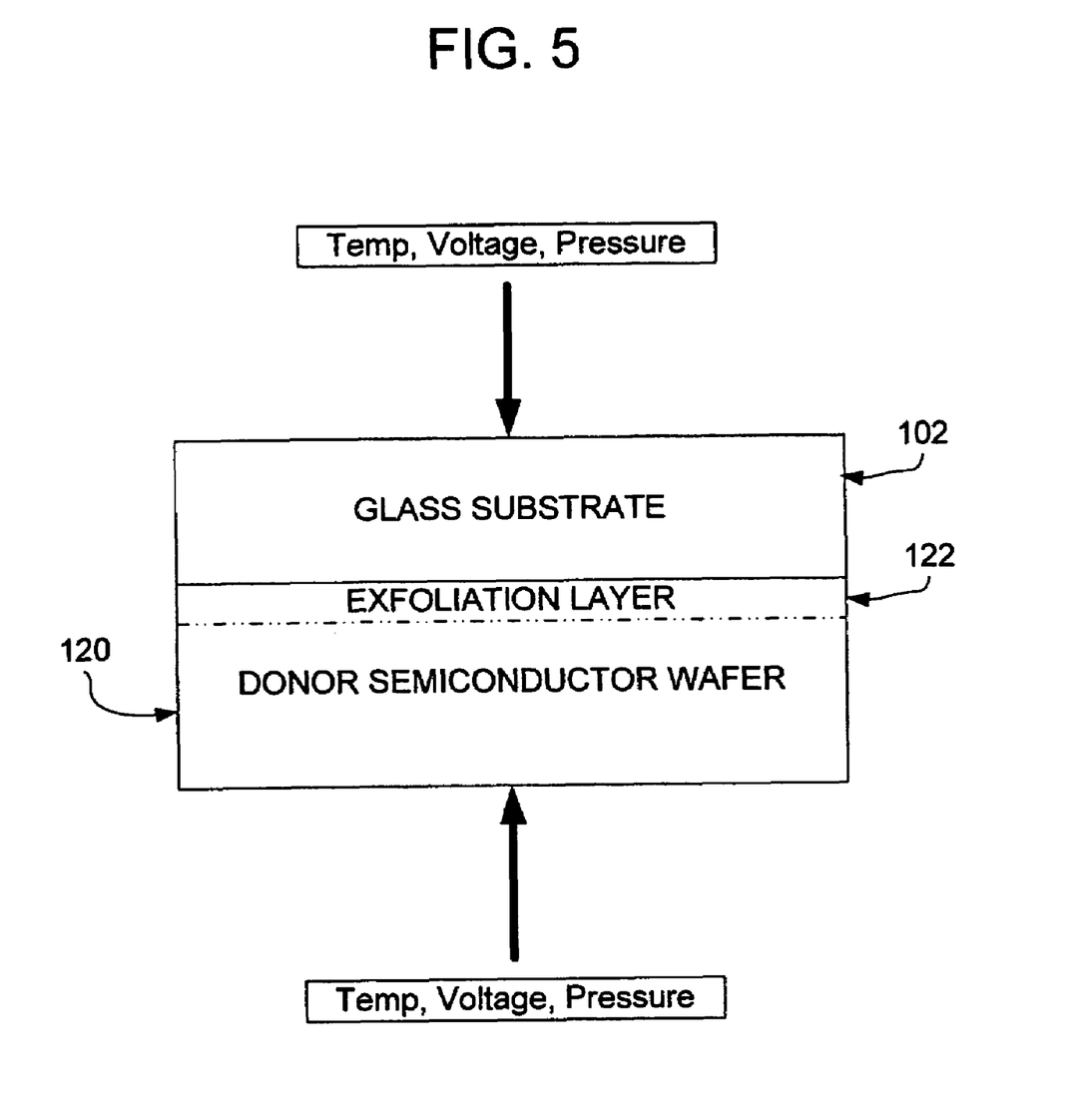

With reference to FIGS. 2 and 5, at action 210 the glass substrate 102 may be bonded to the exfoliation layer 122 using an electrolysis process. A suitable electrolysis bonding process is described in U.S. Patent Application No. 2004/0229444, the entire disclosure of which is hereby incorporated by reference. Portions of this process are discussed below. In the bonding process, appropriate surface cleaning of the glass substrate 102 (and the exfoliation layer 122 if not done already) may be carried out. Thereafter, the intermediate structures are brought into direct or indirect contact to achieve the arrangement schematically illustrated in FIG. 5. Prior to or after the contact, the structure(s) comprising the donor semiconductor wafer 120, the exfoliation layer 122, and the glass substrate 102 are heated under a differential temperature gradient. The glass substrate 102 may be heated to a higher temperature than the donor semiconductor wafer 120 and exfoliation layer 122. By way of example, the temperature difference between the glass substrate 102 and the donor semiconductor wafer 120 (and the exfoliation later 122) is at least 1 degree C., although the difference may be as high as about 100 to about 150 degrees C. This temperature differential is desirable for a glass having a coefficient of thermal expansion (CTE) matched to that of the donor semiconductor wafer 120 (such as matched to the CTE of silicon) since it facilitates later separation of the exfoliation layer 122 from the semiconductor wafer 120 due to thermal stresses.

Once the temperature differential between the glass substrate 102 and the donor semiconductor wafer 120 is stabilized, mechanical pressure is applied to the intermediate assembly. The pressure range may be between about 1 to about 50 psi. Application of higher pressures, e.g., pressures above 100 psi, might cause breakage of the glass substrate 102.

The glass substrate 102 and the donor semiconductor wafer 120 may be taken to a temperature within about +/−150 degrees C. of the strain point of the glass substrate 102.

Next, a voltage is applied across the intermediate assembly, for example with the donor semiconductor wafer 120 at the positive electrode and the glass substrate 102 the negative electrode. The application of the voltage potential causes alkali or alkaline earth ions in the glass substrate 102 to move away from the semiconductor/glass interface further into the glass substrate 102. This accomplishes two functions: (i) an alkali or alkaline earth ion free interface is created; and (ii) the glass substrate 102 becomes very reactive and bonds strongly to the exfoliation layer 122 of the donor semiconductor wafer 120 with the application of heat at relatively low temperatures.

Figure 6:
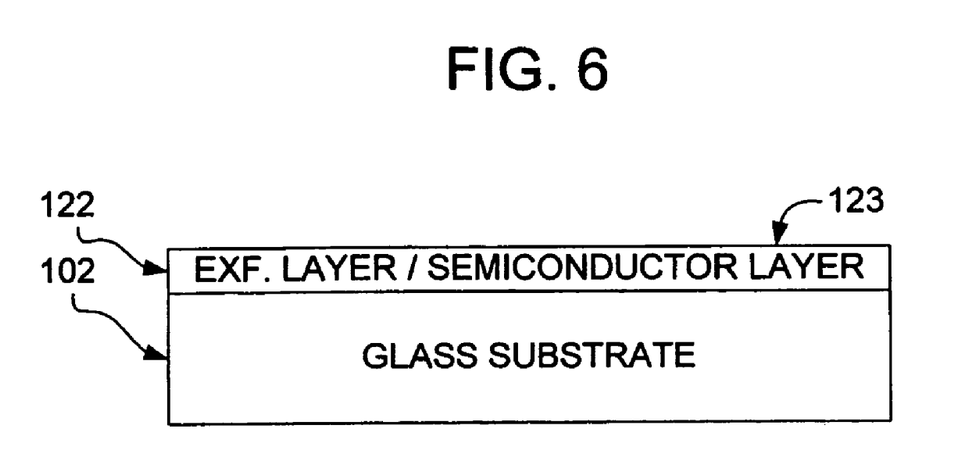

With reference to FIGS. 2 and 6, at action 212 after the intermediate assembly is held under these conditions for some time (e.g., approximately 1 hr or less), the voltage is removed and the intermediate assembly is allowed to cool to room temperature. The donor semiconductor wafer 120 and the glass substrate 102 are then separated, which may include some peeling if they have not already become completely free, to obtain a glass substrate 102 with the relatively thin exfoliation layer 122 formed of the semiconductor material of the donor semiconductor layer 120 bonded thereto. The separation may be accomplished via fracture of the exfoliation layer 122 due to thermal stresses. Alternatively or in addition, mechanical stresses such as water jet cutting or chemical etching may be used to facilitate the separation.

Figure 7:
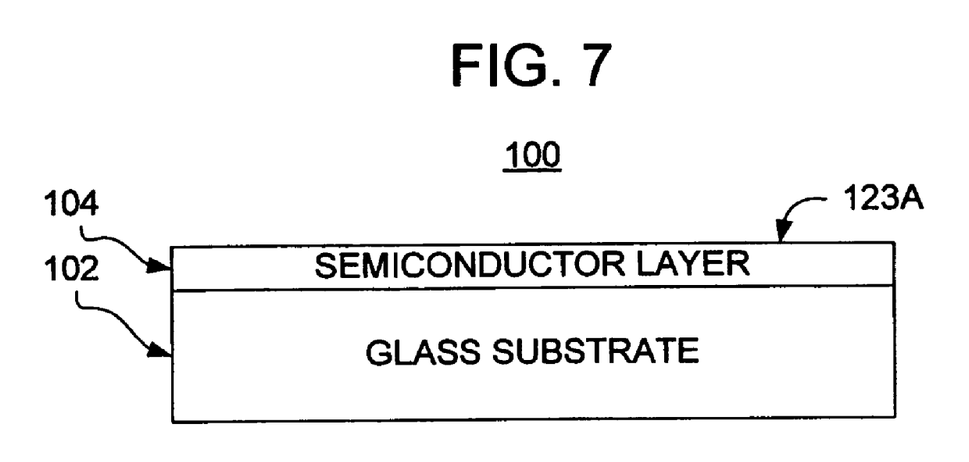

As illustrated in FIG. 6, after separation the resulting structure may include the glass substrate 102 and the exfoliation layer 122 of semiconductor material bonded thereto. At action 214, any unwanted or rough semiconductor material may be removed from the surface 123 via thinning and/or polishing techniques, e.g., via CMP or other techniques known in the art to obtain the semiconductor layer 104 on the glass substrate 102 as illustrated in FIG. 7. As discussed above, the resulting semiconductor layer 104 may be of a single crystal silicon material.

It is noted that the donor semiconductor wafer 120 may be reused to continue producing other SOG structures 100.

Advantageously, reducing the total ion implantation dose during the creation of the exfoliation layer 122 may reduce the cost of producing the SOG 100 and may also increase the throughput of the manufacturing process.

EXAMPLE 1

A donor silicon wafer of 100 mm diameter and 100 microns thick was implanted with hydrogen ions at a dosage of $5 \times 10^{15}$ ions/cm$^2$ and an implantation energy of 100 KeV. The donor silicon wafer was then implanted with helium ions at a dosage of $7.5 \times 10^{15}$ ions/cm$^2$ and an implantation energy of 65 KeV. The donor silicon wafer was then treated in oxygen plasma to oxidize the surface groups. An EAGLE™ glass wafer of 100 mm diameter was then cleaned (with Fischer Scientific Contrad 70 detergent) in an ultrasonic bath for fifteen minutes, a distilled water ultrasonic bath for fifteen minutes, a 10% nitric acid wash, and finally a distilled water ultrasonic bath. Both the donor silicon wafer and the glass wafer were then cleaned in a spin washer/dryer using distilled water. The donor silicon wafer and the glass wafer were then inserted into a suitable bonder, such as a Süss MicroTec SB6. The glass wafer was placed on the negative electrode and the donor silicon wafer was placed on the positive electrode. The two wafers were brought into contact and then heated to 525° C. (at the donor silicon wafer) and 575° C. (at the glass wafer) in a vacuum. A potential of 1750 V was applied across the wafer surfaces for 20 minutes, at the end of which the voltage was brought to zero and the wafers were cooled to room temperature. The donor silicon wafer and the glass wafer could be separated easily. An excellent quality sample with strongly adhered thin silicon layer (500 nm) on the glass wafer was obtained via this process. The quality of the bond was determined via visual inspection and attempts to peel apart the structure at the bond.

Figure 8:
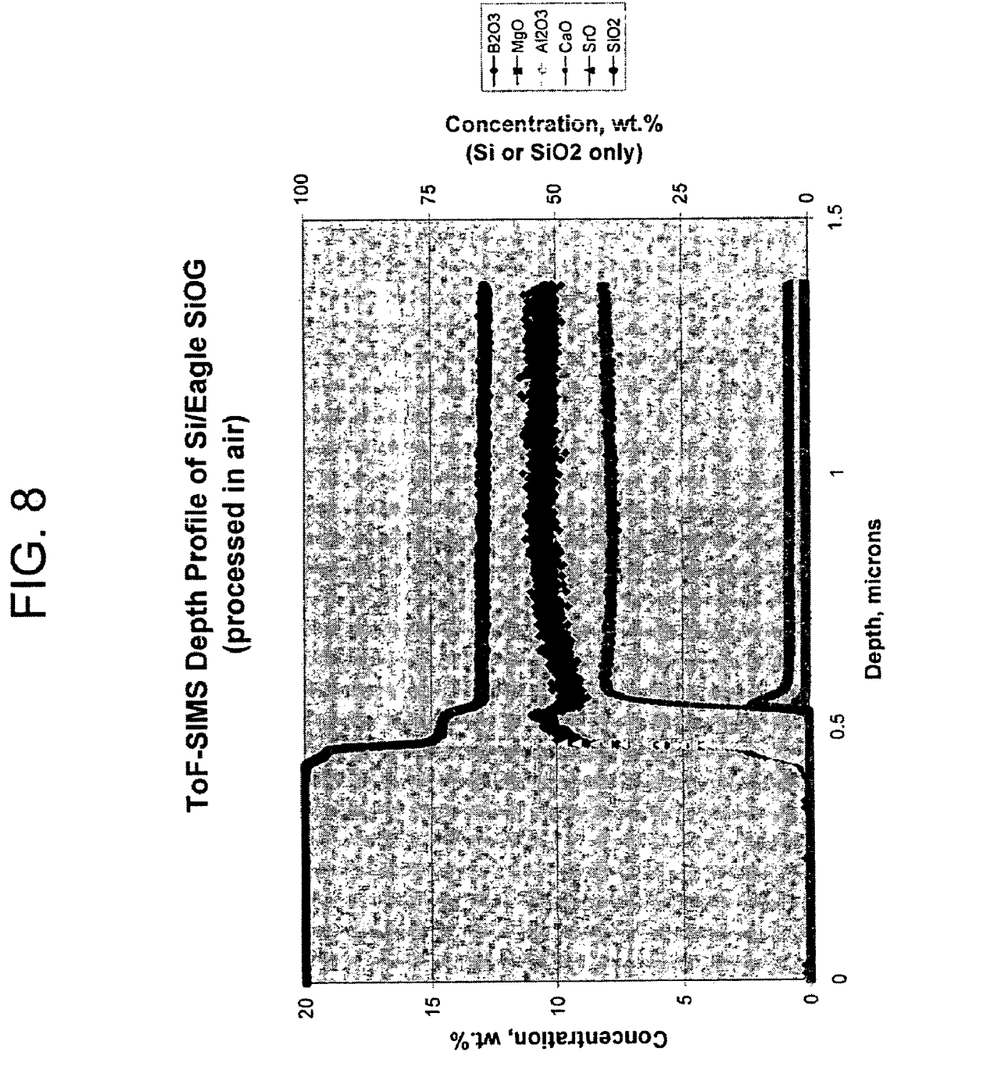
FIG. 8 is a graphical illustration of the TOF-SiMs analysis of an example SOG structure produced in accordance with the process of FIG. 2.

FIG. 8 is a graphical illustration of the TOF-SiMs analysis of the SOG structure produced in accordance with the above example.

EXAMPLE 2

The experiment of Example 1 was repeated, except that the donor silicon wafer was implanted with hydrogen ions at a dosage of $5 \times 10^{15}$ ions/cm$^2$ and at an implantation energy of 70 KeV. The donor silicon wafer was then implanted with helium ions at a dosage of $7.5 \times 10^{15}$ ions/cm$^2$ and at an implantation energy of 40 KeV. The remaining process steps were substantially the same as in Example 1. The resulting SOG structure had a silicon layer of 390 nm bonded to the glass substrate. The quality of the bond was determined via visual inspection and attempts to peel apart the structure at the bond.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a semiconductor on glass structure, comprising:
    subjecting an implantation surface of a donor semiconductor wafer to a hydrogen ion implantation process at a dose of less than $7.5 \times 10^{15}$ ions/cm$^2$ to initiate the creation of an exfoliation layer in the donor semiconductor wafer;
    subjecting the donor surface of the donor semiconductor wafer to at least one of a helium and boron ion implantation process at a dose of less than $1 \times 10^{16}$ ions/cm$^2$ to further create the area of weakening below the implantation surface; and
    bonding the donor surface of the exfoliation layer to the glass substrate using electrolysis.

2. The method of claim 1, wherein the hydrogen ion implantation is conducted at an implantation energy of between about 25-150 KeV.

3. The method of claim 1, wherein the hydrogen ion implantation is conducted at an implantation energy of about 100 KeV.

4. The method of claim 1, wherein the hydrogen ion implantation is conducted at an implantation energy of about 70 KeV.

5. The method of claim 1, wherein the at least one of helium and boron ion implantation is conducted at an implantation energy of between about 25-150 KeV.

6. The method of claim 1, wherein the at least one of helium and boron ion implantation is conducted at an implantation energy of about 65 KeV.

7. The method of claim 1, wherein the at least one of helium and boron ion implantation is conducted at an implantation energy of about 40 KeV.

8. The method of claim 1, wherein a total dose of the first ion implantation process and the at least one second ion implantation process is between about $10\text{-}20 \times 10^{15}$ ions/cm$^2$.

9. The method of claim 1, wherein a total dose of the first ion implantation process and the at least one second ion implantation process is about $12.5 \times 10^{15}$ ions/cm$^2$.

10. The method of claim 1, wherein the step of bonding includes:
    heating at least one of the glass substrate and the donor semiconductor wafer;
    bringing the glass substrate into direct or indirect contact with the donor semiconductor wafer through the exfoliation layer; and
    applying a voltage potential across the glass substrate and the donor semiconductor wafer to induce the bond.

11. The method of claim 10, wherein the temperature of the glass substrate and the semiconductor wafer are elevated to within about 150 degrees C. of the strain point of the glass substrate.

12. The method of claim 10, wherein the temperatures of the glass substrate and the semiconductor wafer are elevated to different levels.

13. The method of claim 10, wherein the voltage potential across the glass substrate and the semiconductor wafer is between about 100 to 2000 volts.

14. The method of claim 10, wherein stress is induced by cooling the bonded glass substrate, exfoliation layer, and donor semiconductor wafer such that a fracture occurs substantially at the exfoliation layer.

15. The method of claim 1, wherein the donor semiconductor wafer is taken from the group consisting of: silicon (Si), germanium-doped silicon (SiGe), silicon carbide (SiC), germanium (Ge), gallium arsenide (GaAs), GaP, and InP.

16. A method of forming a semiconductor on glass structure, comprising:
    subjecting an implantation surface of a donor semiconductor wafer to multiple ion implantation processes to create an exfoliation layer in the donor semiconductor wafer, wherein:
    at least one of: (i) a type of ion, (ii) a dose, and (iii) an implantation energy of at least two of the multiple ion implantation processes differ from one another; and
    a total dose of the ion implantation processes is less than $1.75 \times 10^{16}$ ions/cm$^2$.

17. The method of claim 16, wherein the number of ion implantation processes is two.

18. The method of claim 16, wherein
    the total dose of the ion implantation processes is about $12.5 \times 10^{15}$ ions/cm$^2$.

19. The method of claim 16, wherein:
    a first ion implantation process includes a hydrogen ion implantation step at a dose of between about $2\text{-}10 \times 10^{15}$ ions/cm$^2$; and
    a second ion implantation process includes a helium ion implantation step at a dose of between about $2\text{-}10 \times 10^{15}$ ions/cm$^2$.

20. The method of claim 18, wherein:
    the hydrogen ion implantation is conducted at a dose of about $5 \times 10^{15}$ ions/cm$^2$; and
    the helium ion implantation is conducted at a dose of about $7.5 \times 10^{15}$ ions/cm$^2$.

* * * * *